United States Patent [19]
Schoellkopf

[11] Patent Number: 6,094,383
[45] Date of Patent: Jul. 25, 2000

[54] PROGRAMMABLE NON-VOLATILE MEMORY DEVICE AND METHOD OF PROGRAMMING THE SAME

[75] Inventor: Jean-Pierre Schoellkopf, Grenoble, France

[73] Assignee: STMicroelectronics S.A., Gentilly, France

[21] Appl. No.: 09/251,632

[22] Filed: Feb. 17, 1999

[30] Foreign Application Priority Data

Feb. 19, 1998 [FR] France .................................. 98 02221

[51] Int. Cl.[7] .................................................. G11C 29/00
[52] U.S. Cl. ...................................... 365/200; 365/230.06
[58] Field of Search .............................. 365/200, 189.07, 365/230.03; 371/10.3

[56] References Cited

U.S. PATENT DOCUMENTS

| | | | |
|---|---|---|---|
| 5,381,370 | 1/1995 | Lacey et al. .............................. | 365/200 |
| 5,604,702 | 2/1997 | Tailliet ..................................... | 365/200 |
| 5,677,883 | 10/1997 | Miwa ..................................... | 365/200 |

FOREIGN PATENT DOCUMENTS 0 242 854   10/1987   European Pat. Off. .

OTHER PUBLICATIONS

French Search Report dated Nov. 6, 1998 with annex on French Application No. 98–02221.

*Primary Examiner*—Vu A. Le
*Attorney, Agent, or Firm*—Theodore E. Galanthay; Fleit, Kain, Gibbons, Gutman & Bongini P.L.

[57] ABSTRACT

A programmable non-volatile memory device has a plurality of rows of memory cells that are accessible through selection addresses, with the number of physical rows being greater than the number of rows that are addressable at a given time. An associating circuit associates selected physical rows of the memory device with selection addresses. The associating circuit includes an associative memory that has a programmable memory location for each physical row of the memory device, and each memory location in the associative memory has an address field and at least one state bit. In one preferred embodiment, in the read mode, a row of the memory device is selected when the corresponding memory location in the associative memory contains the received address and state bits indicating that the row stores valid data for the received address. A method of programming such a non-volatile memory device is also provided.

18 Claims, 1 Drawing Sheet

PROGRAMMABLE NON-VOLATILE MEMORY DEVICE AND METHOD OF PROGRAMMING THE SAME

CROSS-REFERENCE TO RELATED APPLICATIONS

This application is based upon and claims priority from prior French Patent Application No. 98-02221, filed Feb. 19, 1998, the entire disclosure of which is herein incorporated by reference.

BACKGROUND OF THE INVENTION

1. Field of the Invention

The present invention relates to non-volatile memory devices, and more specifically to a programmable non-volatile memory device having additional rows of memory cells that can be reprogrammed to modify the stored data stored.

2. Description of Related Art

FIG. 1 is a block diagram of a conventional programmable non-volatile memory device. The device includes a matrix 1 having non-volatile memory cells (or permanent memory points) organized into rows and columns. Generally, the number of columns corresponds to the number of bits that are stored for each data word, and the number of rows is greater than the number of rows required for storing all data words (i.e., the number of addresses or addressable words in the memory). For example, the non-volatile memory device of FIG. 1 holds m data words and has m+n rows in the memory cell matrix 1. Such a non-volatile memory point structure is typically formed by fusible elements that cannot revert back to an inactive state after being programmed into an active state. Thus, the n additional (or redundant) rows of memory cells allow for limited non-volatile reprogramming of the memory device.

The memory cell matrix 1 is associated with a row addressing circuit 2 that decodes and routes row addresses received from an address bus A. In other words, the row addressing circuit 2 selects a row of memory cells based on the address received at the input of the memory device. Additionally, the memory cell matrix 1 is associated with a read/write amplifier circuit 3 that receives and outputs data D typically having a number of bits equal to the number of columns. In practical memory devices, the row addressing circuit forms an array of switches for routing the outputs of an address decoder to the m word lines so as to select a row of memory cells in the matrix 1. Each row of the matrix 1 can only be programmed once, and the n additional rows are provided to allow a non-volatile reprogramming of rows of the memory matrix. Thus, in the memory device of FIG. 1, there are n possibilities for memory reprogramming and then the non-volatile memory device becomes non-programmable (i.e., read-only).

SUMMARY OF THE INVENTION

In view of these drawbacks, it is an object of the present invention to remove the above-mentioned drawbacks and to provide a non-volatile memory device with improved reprogramming possibilities. The non-volatile memory device is provided with an addressing system that increases the number of possible reprogrammings for a given number of redundant rows. Thus, a "virtual" increase in the reprogramming capacity of a non-volatile memory device is provided without increasing the size of the memory cell matrix.

One embodiment of the present invention provides a non-volatile memory having rows of memory cells that are accessible through an address bus, with the number of physical rows being greater than the number of rows that are addressable at a given time. An associating circuit associates selected physical rows of the memory device with selection addresses. The associating circuit includes an associative memory that has a programmable memory location for each physical row of the memory device, and each memory location in the associative memory has an address field and at least one state bit. In the read mode, a row of the memory device is selected when the corresponding memory location in the associative memory contains the received address and state bits indicating that the row stores valid data for the received address. In one preferred embodiment, there are two state bits, and each selection address is associated with a row of the device whose corresponding memory location has one state bit in an active state and the other state bit in an inactive state. The state bits of all remaining memory locations are both in an active state or both in an inactive state. Additionally, in preferred embodiments, each memory location in the associative memory includes one bit for each line in the address bus plus one bit for each state bit.

Another embodiment of the present invention provides a method of programming a non-volatile memory device. According to the method, for each address/data pair of an address in the associative memory and the data stored in a corresponding row of the memory device, new data is compared with the stored data. If possible, the received data is reprogrammed over the stored data. Otherwise, the corresponding row of the memory device is identified as being reusable and the address/data pair is identified as having to be relocated. In one preferred method, for each address/data pair identified for relocation, it is determined if one of the reusable rows of the memory device could be used to store the new data, and if none can be so used, a free additional row is programmed to store the new data. Then, all reusable rows of the memory device that have not been used to store new data are identified as invalid.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
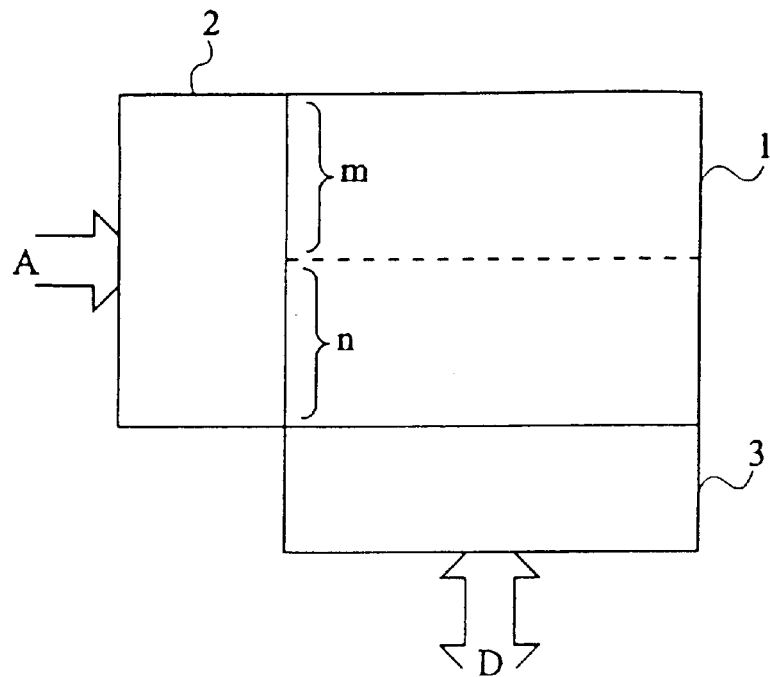
FIG. 1 is a block diagram showing a conventional non-volatile memory device.
Figure 2:
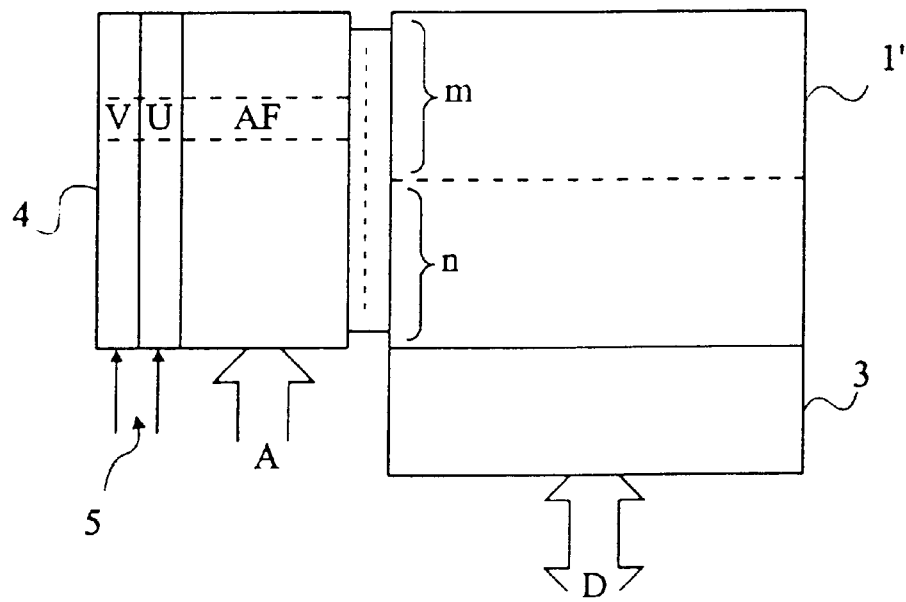
FIG. 2 is a block diagram showing a programmable non-volatile memory device according to an embodiment of the present invention.

A programmable non-volatile memory device according to an embodiment of the present invention is shown in FIG. 2. (For simplicity, only the elements of the non-volatile memory and its addressing circuit that are necessary to the understanding of the present invention are shown in FIG. 2 and described below.) As shown, a matrix 1' of conventional non-volatile memory cells or points includes a number m of rows (or word lines) corresponding to the number of addressable rows and a number n of additional (or redundant) rows to enable a reprogramming. Thus, the exemplary embodiment of FIG. 2 has m addressable word lines and n reprogramming word lines. Further, a conventional read/write amplifier circuit 3 is connected between the memory cell matrix 1' and a data bus D.

The m+n rows of the memory cell matrix 1' are addressed by an associative memory 4 that has a programmable location for each memory row (i.e., word line). The associative memory 4 is used to select a word line of the matrix 1' when the corresponding memory location contains the address received from the address bus A, and the memory locations in the associative memory all contain different addresses so that one word line is selected at a time. Each memory location in the associative memory 4 stores an address field AF and two state bits V and U, and includes as many bits in the address field AF as there are lines in the address bus A plus two bits for the state bits V and U. The state bits V and U allow differentiation between memory locations that contain an address and memory locations that are empty, and among the memory locations containing an address, memory locations in which the corresponding data can be reused and memory locations that are definitively unavailable. Thus, the state bits allow previously-programmed word lines to be reused.

For example, if a word line is free for a possible reprogramming, the corresponding state bit V is set to the active state (e.g., logic "1"). Conversely, if the word line has already been programmed, the corresponding state bit V is set to the inactive state (e.g., logic "0"). Similarly, selectable and non-selectable word lines are indicated by the corresponding state bits U being in the active or inactive states, respectively. Alternatively, the state bits U and V can be interpreted as a bit pair. That is, a state of "11" indicating a free input (or blank) corresponding word line, a state "01" indicating an active (or programmed) word line, and a state "00" indicating an unavailable (or definitively lost) word line.

In read mode, the associative memory 4 replaces the address decoder and routing elements of the conventional programmable non-volatile memory. In particular, each time an address to be read is supplied to the memory, the address is compared with the address fields AF of the associative memory 4 and an active state "01" is compared with the state bits VU. The word line corresponding to a memory location in the associative memory 4 is only selected if the address field bits AF and the state bits VU coincide with the bits of the supplied address and the pair "01". In other words, a word line corresponding to a memory location whose state bits VU equal "00" or "11" is never selected in read mode regardless of the contents of address field bits AF. Thus, a predetermined word line can be associated with any address simply by writing the address into the address field of the corresponding memory location in the associative memory 4 and by setting the corresponding state bits VU to "01".

Additionally, the associative memory 4 is used to authorize several programmings of the same word line by taking advantage of the fact that the state of a non-volatile memory point is fixed only for one of the logic states (i.e., "0" or "1"). The other logic state of a memory point corresponds to an "unprogrammed" state in which the memory point can be programmable to the fixed state. However, once programmed to the fixed state, a memory point cannot be returned to the "unprogrammed" state. For example, assuming that the initial (i.e., unprogrammed) state of a memory point is "1", a word line having memory points containing the data "11110101" can be reprogrammed to store the data "01010000".

An embodiment of the reprogramming method of the present invention will now be explained in detail with reference to the non-volatile memory device of FIG. 2. Initially, with the memory blank, addresses A and data D are sequentially programmed into the associative memory 4 and non-volatile memory cell matrix 1', respectively. At the same time, the state bits VU of the word lines being programmed are programmed to the active state "01". When the memory is to be reprogrammed, a first step determines if for each address/data pair (i.e., address in the associative memory and corresponding data in memory cell matrix 1') the stored data is being modified. If not being modified, the reprogramming process moves on to the next address/data pair.

On the other hand, if the stored data is being modified, it is first determined if the new data bits can be reprogrammed over the bits presently being stored by the non-volatile memory points of the addressed word line. If the new data cannot be reprogrammed over the present data, the address of the word line is stored as being reusable and the address/data pair is stored as having to be "relocated" (i.e., programmed on another word line). More specifically, two tables are used during the reprogramming process for the non-volatile memory to indicate reusable word lines and address/data pairs to be relocated. Because these two tables are only used during reprogramming, they need only be temporarily provided and can simply be stored in the memory of the microprocessor controlling the reprogramming process.

After each address/data pair is processed in the first step, a second step is used to process all listings in the table of address/data pairs to be relocated. In particular, for each listing in the relocation table, it is determined if any word line listed in the table of reusable word lines can be reprogrammed to store the new data. If so, the new data is reprogrammed over the present data on the reusable word line, and that word line is removed from the table of reusable word lines. Conversely, if no word line can be reused, an entirely free word line is used if one is still available, and the state bits VU of that word line are changed so as to set state bit V to logic "1" to indicate that the memory location in the associative memory is now active.

If there are no remaining free word lines, the non-volatile memory device is no longer reprogrammable and must be discarded or changed. Assuming there is a sufficient number of free word lines to process all of the listings in the table of address/data pairs to be relocated, all word lines that are left in the table of reusable word lines are marked as being definitively lost by setting each one's corresponding state bit U to logic "0" in a third step of the reprogramming process. This allows the proper (i.e., active) word line to be identified when two address fields AF in the associative memory contain the same address.

Thus, the present invention provides a "virtual" increase in the reprogramming capacity of a non-volatile memory having a given number of additional lines. Additionally, the reprogramming method of the present invention is not dependent on the technology used to form the non-volatile memory cells. For example, conventional CMOS anti-fuse cells or conventional EPROM cells can be used. Further, in an initial testing process, the associative memory allows the additional rows to be used as redundant rows for repairing defective rows. For example, upon power-on, a self-test and repair circuit can be used to test the memory rows and relocate rows that fail.

One such self-test circuit successively scans the memory locations in the associative memory by writing a successive address and a state bit U of "1" into each memory location (with state bit V being "0" for a state bit pair VU of "01"). This makes the corresponding row or word line accessible for conventional testing. If the row passes, the values written in the memory location are left unchanged and the testing proceeds with the next memory location. On the other hand, if the row is defective, the corresponding state bit U is changed to "0" to disable the corresponding word line, and the address that was written into the memory location is again written into the next memory location. This testing process is repeated until the top (or highest) address of the memory device has been written into a memory location in the associative memory and the corresponding row passes the test. For each remaining memory location, the state bit U is normally at "1" and the value in the address field is arbitrary.

In another embodiment of the reprogramming method of the present invention, the search for a reusable word line for an address/data pair to be relocated is performed by searching among the reusable word lines for the word line that will require the least modifications to store the new data (i.e., the reusable word line in which the least bits must be changes to the irreversible or fixed state). By carefully selecting the word line to be reused instead of simply selecting the first possible word line in the list of reusable word lines, the reprogramming of the word lines is optimized to even further increase the "virtual" reprogramming capacity of the non-volatile memory device.

The memory reprogramming methods of the present invention can be executed using external testing or programming equipment, a microprocessor, or internal circuitry. Further, the associative memory and temporary storage (for the reusable word line and relocation tables) described above can be practically implemented using various types of storage by one of ordinary skill in the art. An illustrative application for the non-volatile memory device of the present invention is a memory chip on a credit card.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A programmable non-volatile memory device comprising:
   a plurality of rows of memory cells that are accessible through selection addresses, the number of physical rows being greater than the number of rows that are addressable at a given time; and
   an associating circuit for associating selected physical rows of the memory device with selection addresses,
   wherein the associating circuit includes an associative memory that has a programmable memory location for each physical row of the memory device, and
   each memory location in the associative memory includes an address field and at least one state bit.

2. The memory device as defined in claim 1, wherein each memory location in the associative memory includes at least two state bits.

3. The memory device as defined in claim 2, wherein in read mode, one of the physical rows of the memory device is selected when the corresponding memory location in the associative memory contains the selection address to be read and state bits indicating that the row stores valid data for the selection address.

4. The memory device as defined in claim 2,
   wherein each of the selection addresses is associated with a physical row of the memory device whose corresponding memory location in the associative memory has one state bit in an active state and another state bit in an inactive state, and
   these state bits in all remaining memory locations in the associative memory are either both in an active state or both in an inactive state.

5. The memory device as defined in claim 1, further comprising:
   an address bus interface for connecting to an address bus and receiving the selection address,
   wherein the address field of each memory location in the associative memory includes one bit for each line of the address bus.

6. A programmable non-volatile memory device for storing data words at addresses within an address range, said memory device comprising:
   a plurality of data word storage locations, the number of data word storage locations being greater than the number of addresses in the address range of the memory device; and
   an associating memory for associating selected data word storage locations with the addresses in the address range, the associating memory storing an address and at least one state flag for each data word storage location of the memory device.

7. The memory device as defined in claim 6, wherein the associating memory stores at least two state flags for each data word storage location of the memory device.

8. The memory device as defined in claim 7, wherein when an address is received in read mode, the associating memory selects the data word storage location whose corresponding stored address is the same as the received address and whose state flags indicate that the data word storage location stores valid data.

9. The memory device as defined in claim 6, wherein when an address is received in read mode, the associating memory selects the data word storage location whose corresponding stored address in the associating memory is the same as the received address and whose state flag indicates that the data word storage location stores valid data.

10. The memory device as defined in claim 6,
    wherein the associating memory stores two state flags for each data word storage location of the memory device,
    each of the addresses in the address range is associated with a data word storage location whose corresponding state flags in the associating memory consist of one state flag in an active state and another state flag in an inactive state, and
    each of the remaining data word storage locations have corresponding state flags that are either both in an active state or both in an inactive state.

11. The memory device as defined in claim 6, further comprising:
    an address bus interface for receiving addresses from an address bus, wherein the address stored in the associating memory for each of the data word storage locations contains one bit for each line of the address bus.

12. A method of programming a non-volatile memory device having an associative memory and data storage locations with an address/data pair being formed by a valid address stored in the associative memory and data stored in a corresponding data storage location of the memory device, said method comprising the steps of:

comparing new data to be stored at a given address with the data being stored by the address/data pair storing the given address;

determining if the new data can be reprogrammed over the data being stored; and if the new data cannot be reprogrammed over the data being stored, indicating that the corresponding data storage location is reusable and indicating that the address/data pair has to be relocated.

13. The method as defined in claim 12, further comprising the step of if the new data can be reprogrammed over the data being stored, reprogramming the new data over the data being stored.

14. The method as defined in claim 13, further comprising the step of repeating the steps of comparing and determining for each address/data pair in the memory device.

15. The method as defined in claim 12, further comprising the steps of:

for each address/data pair indicated for relocation, determining if any of the data storage locations indicated as being reusable could be reprogrammed to store the new data; and if no reusable data storage location could be reprogrammed to store the new data, programming the new data in a free data storage location.

16. The method as defined in claim 15, wherein in the step of programming the new data in a free data storage location, one state flag for the data storage location is set to an active state and another state flag for the data storage location is set to an inactive state.

17. The method as defined in claim 15, further comprising the step of for all data storage locations indicated as being reusable that are not reprogrammed with new data, indicating that these data storage locations are invalid.

18. The method as defined in claim 12, further comprising the step of when an address is received in read mode, selecting the data storage location corresponding to the address/data pair whose stored address is the same as the received address and whose state flags indicate that the data word storage location stores valid data.

* * * * *